United States Patent
Nasserbakht

[11] Patent Number: 6,008,713
[45] Date of Patent: Dec. 28, 1999

[54] MONOLITHIC INDUCTOR

[75] Inventor: Gitty N. Nasserbakht, Dallas, Tex.

[73] Assignee: Texas Instruments Incorporated, Dallas, Tex.

[21] Appl. No.: 08/803,175

[22] Filed: Feb. 19, 1997

Related U.S. Application Data

[60] Provisional application No. 60/012,504, Feb. 29, 1996.

[51] Int. Cl.$^6$ .................................. H01F 5/00; H03H 7/00
[52] U.S. Cl. ............................ 336/200; 336/232; 333/185
[58] Field of Search ........................... 333/185; 257/531, 257/532–536; 336/200, 232

[56] References Cited

U.S. PATENT DOCUMENTS

| | | | |
|---|---|---|---|
| 5,070,317 | 12/1991 | Bhagat | 336/200 |
| 5,136,357 | 8/1992 | Hesson et al. | 357/51 |
| 5,260,595 | 11/1993 | Hayama | 257/379 |
| 5,360,989 | 11/1994 | Endo | 257/532 |
| 5,450,263 | 9/1995 | Desaigoudar | 360/110 |
| 5,492,856 | 2/1996 | Ikeda et al. | 437/60 |
| 5,539,241 | 7/1996 | Abidi et al. | 257/531 |
| 5,661,332 | 8/1997 | Nakamura et al. | 257/532 |
| 5,705,963 | 1/1998 | Ikeda et al. | 333/184 |

FOREIGN PATENT DOCUMENTS

| | | | |
|---|---|---|---|
| 212-267 | 3/1987 | European Pat. Off. | 257/536 |

*Primary Examiner*—Renee S. Luebke
*Assistant Examiner*—Anh Mai
*Attorney, Agent, or Firm*—Jacqueline J. Garner; Wade James Brady; Richard L. Donaldson

[57] ABSTRACT

The monolithic inductor (30) includes a substrate (38), a spiral metal trace (32) disposed insulatively above the substrate (38), where a parasitic capacitance (56) is generated between the spiral metal trace (32) and the substrate (38), and a depletion layer is generated under the spiral metal trace (32) with a depletion junction capacitance (58) coupled in series with the parasitic capacitance (56). The overall capacitance is thus reduced, which enhances the self-resonance frequency of the inductor (30). For the same self-resonance frequency, a thicker metal trace may be used to implement the inductor, resulting in an improved quality factor, Q.

2 Claims, 1 Drawing Sheet

MONOLITHIC INDUCTOR

This Appln claims the benefit of U.S. Provisional Appln No. 60/012,504 filed Feb. 29, 1996.

TECHNICAL FIELD OF THE INVENTION

This invention is related in general to the field of semiconductor devices. More particularly, the invention is related to a monolithic inductor.

BACKGROUND OF THE INVENTION

Monolithic inductors have been a challenging puzzle for engineers and academia alike. In order to manufacture a high quality inductor with minimal resistive loss, a sufficiently wide metal trace in the form of a spiral is laid down on the silicon. However, the enlarged area of the metal trace increases the parasitic capacitance between the metal trace and the substrate. The result is reduced self-resonance frequency of the inductor, which greatly limits the operating range of the inductor.

One proposed solution to this problem is to use special processing steps to form a very thick dielectric layer beneath the metal trace of the inductor. This is a non-conventional processing step that would add substantial fabrication complexity and increase the cost thereof.

Another proposal to improve the self-resonance frequency of the monolithic inductor is to create an air gap between the metal trace and the silicon substrate by etching away the silicon beneath the inductor. The inductor is effectively suspended without support underneath. This is a dubious solution because questions remain concerning the fragile structure, packaging, and general reliability of the device.

SUMMARY OF THE INVENTION

Accordingly, there is a need for a monolithic inductor with improved self-resonance frequency.

In accordance with the present invention, a monolithic inductor and the method for making the same are provided which eliminates or substantially reduces the disadvantages associated with prior inductors.

In one aspect of the invention, a monolithic inductor includes a substrate, a spiral metal trace disposed insulatively above the substrate, where a parasitic capacitance is generated between the spiral metal trace and the substrate, and a depletion layer generated under the spiral metal trace and having a depletion junction capacitance coupled in series with the parasitic capacitance.

In another aspect of the invention, a method for improving the self-resonance frequency of a monolithic inductor is provided. The inductor is formed of a spiral metal trace insulatively disposed above a substrate. The method includes the step of generating a capacitance in series with a parasitic capacitance generated between the spiral metal trace and the substrate to decrease the total capacitance thereof.

BRIEF DESCRIPTION OF THE DRAWINGS

For a better understanding of the present invention, reference may be made to the accompanying drawings, in which.

DETAILED DESCRIPTION OF THE INVENTION

Figure 1:
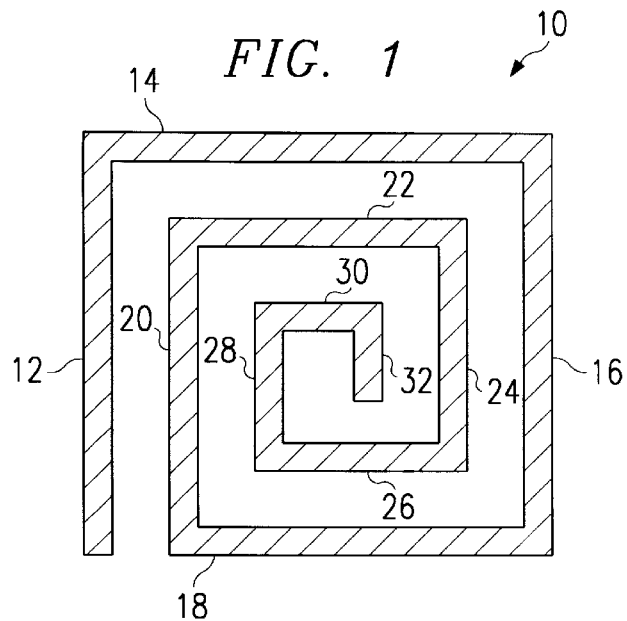
FIG. 1 is a plan view of a metal trace of a monolithic inductor.
Figure 2:
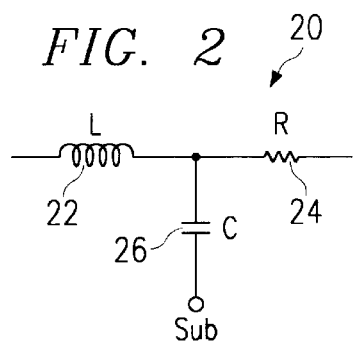
FIG. 2 is a simplified circuit diagram representation of a metal trace section.

The preferred embodiment(s) of the present invention is (are) illustrated in FIGS. 1–4, like reference numerals being used to refer to like and corresponding parts of the various drawings.

Referring to FIG. 1, an inductor 10 composed of a metal trace having multiple straight segments 12–32 forming a spiral is shown. Each segment 12–32 may be represented by a simplified circuit diagram 20 shown in FIG. 2. Each metal trace segment 12–32 has some inductance, as represented by an inductor 22, some resistance, as represented by a resistor 24, and some parasitic capacitance between the metal trace segment and the substrate (across an oxide layer beneath the metal trace), as represented by a capacitor 26. It is the quantity of the parasitic capacitance, C, that affects self-resonance frequency of inductor 10. When metal trace segments 12–32 are made wider to improve the resistive loss of inductor 10, the parasitic capacitance is increased, with the attendant undesirable result of reduced self-resonance frequency of inductor 10.

Figure 3:
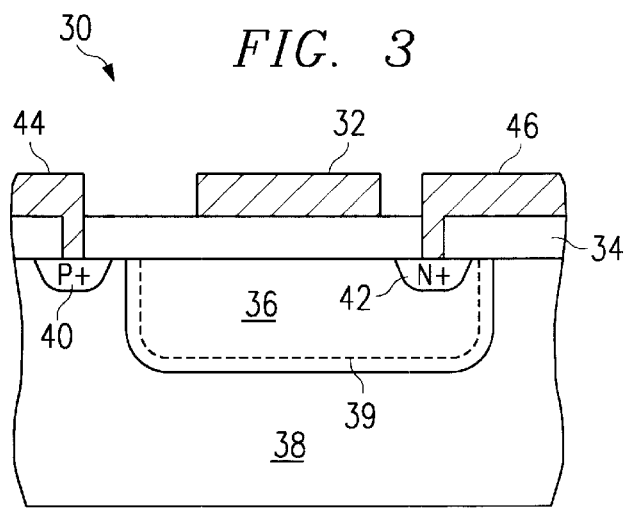
FIG. 3 is a greatly enlarged schematic elevational cross-sectional view of a monolithic inductor constructed according to the teachings of the present invention.

Referring to FIG. 3, a greatly enlarged cross-sectional view of an inductor, indicated generally at 30, is shown. FIG. 3 shows an exemplary structure for an inductor 30 constructed according to the teachings of the present invention. Inductor 30 includes a spiral metal trace 32 positioned above an oxide layer 34. A lightly doped deep n-well is formed directly beneath metal trace 32 in a p-type substrate 38. A p+ diffusion region 40 and an n+ diffusion region 42 are formed near the surface of substrate 38 on either side of metal trace 32, and contacts 44 and 46 to p+ and n+ diffusion regions 40 and 42, respectively, are formed.

Please note that the teachings of the instant invention may also be implemented with semiconductor materials of the opposite conductivity type as set forth above. For example, a lightly doped deep p-well 36 formed in an n-type substrate 38, and an n+ diffusion region 40 and a p+ diffusion region 42.

Figure 4:
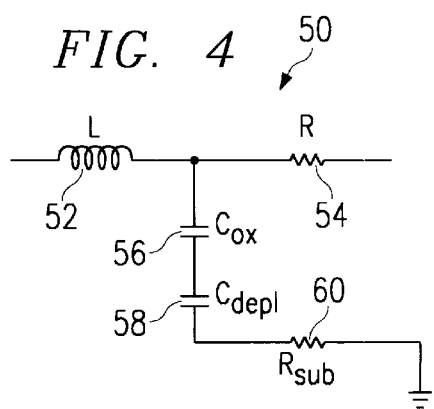
FIG. 4 is a simplified circuit diagram representation of a metal trace section of a monolithic inductor constructed according to the teachings of the present invention.

Under reverse bias, with a positive potential applied to contact 46 with respect to contact 44, a depletion layer 39 or junction is formed across the n-well substrate junction with an attendant depletion capacitance, $C_{depl}$. Referring to FIG. 4, the resultant circuit representation of each segment 12–32 of the metal trace includes an inductor 52 coupled to a resistor 54, and a parasitic capacitor 56 across oxide layer 34, $C_{ox}$, and a depletion capacitor 58, $C_{depl}$, coupled in series with capacitor 56. The resistance in substrate 38 to ground is further represented by a resistor 60. Therefore, with $C_{ox}$ in series with $C_{depl}$.

$$\frac{1}{C_T} = \frac{1}{C_{ox}} + \frac{1}{C_{depl}}$$

where $C_T$ is the total capacitance across oxide layer 34 and the depletion junction in n-well 36. As a result, the total capacitance is less than the capacitance across oxide layer 34 alone. The reduction in the total capacitance leads to an increase in the self-resonance frequency, $f_{res}$, since $$f_{res} = \frac{1}{2\Pi\sqrt{LC}}.$$

To further illustrate by way of an example, if $$C_{depl} = C_{ox}$$

then $$C_T = \frac{C_{ox}}{2}.$$

This example results in a 40% improvement in the self-resonance frequency in the inductor. Thus, an oxide layer thickness of approximately 2 μm, for example, may require a depletion layer of approximately 6 μm to achieve a similar total capacitance, which is available under only a few volts of reverse bias in the instant invention. On-chip circuitry may be used to generate a reverse bias potential greater than $V_{dd}$ to maximize the depletion layer thickness. Deep n-well 36 may be completely depleted by appropriate reverse bias potential.

Inductors are measured by a quality factor, $$Q = \frac{\omega L}{R}.$$

By decreasing the total capacitance according to the teachings of the present invention, the metal trace can be made much thicker for achieving the same self-resonance frequency, which results in smaller resistance R and a substantial improvement in Q.

It is important to note that conventional semiconductor fabrication steps may be used to form each structure in inductor 30 shown in FIG. 3. Therefore, no special semiconductor processing steps are required. Fabrication parameters such as doping concentrations, dopant compositions, oxidation temperatures and durations, deposition and etching methods, and layer thicknesses, except otherwise specified, are conventional and known in the art of semiconductor device processing. Although not explicitly shown, other known semiconductor structures capable of creating a depletion layer capacitance in series with the parasitic oxide capacitance beneath the metal trace are also contemplated as part of the teachings of the present invention.

Although the present invention and its advantages have been described in detail, it should be understood that various changes, substitutions and alterations can be made therein without departing from the spirit and scope of the invention as defined by the appended claims. For example, the above describes a top-side substrate contact, however the invention also applies to back-side substrate contacts.

What is claimed is:

1. A monolithic inductor, comprising:

a spiral metal trace separated from a substrate of a first conductivity type by only an insulator layer except at ends of said spiral metal trace;

a well region of a second conductivity type located in said substrate below said spiral metal trace;

a first contact coupled to said well region; and a second contact coupled to said substrate.

2. The monolithic inductor of claim 1, wherein said spiral metal trace is planar.

\* \* \* \* \*